United States Patent
Rumrill

(10) Patent No.: US 9,984,818 B2
(45) Date of Patent: May 29, 2018

(54) CURRENT HARVESTING TRANSFORMER WITH PROTECTION FROM HIGH CURRENTS

(71) Applicant: SENTIENT ENERGY, INC., Burlingame, CA (US)

(72) Inventor: Ronald S. Rumrill, Union City, CA (US)

(73) Assignee: SENTIENT ENERGY, INC., Burlingame, CA (US)

( * ) Notice: Subject to any disclaimer, the term of this patent is extended or adjusted under 35 U.S.C. 154(b) by 0 days. days.

(21) Appl. No.: 15/369,667

(22) Filed: Dec. 5, 2016

(65) Prior Publication Data

US 2017/0162320 A1    Jun. 8, 2017

Related U.S. Application Data

(60) Provisional application No. 62/263,512, filed on Dec. 4, 2015.

(51) Int. Cl.
| | |
|---|---|
| *G01R 15/18* | (2006.01) |
| *H01F 38/14* | (2006.01) |
| *H02H 9/02* | (2006.01) |
| *G01R 15/20* | (2006.01) |
| *G01R 31/40* | (2014.01) |

(52) U.S. Cl.
CPC .......... *H01F 38/14* (2013.01); *G01R 15/207* (2013.01); *G01R 31/40* (2013.01); *H02H 9/021* (2013.01)

(58) Field of Classification Search
CPC . G01R 1/20; G01R 1/22; G01R 1/203; G01R 15/146; G01R 19/0007
See application file for complete search history.

(56) References Cited

U.S. PATENT DOCUMENTS

| | | |
|---|---|---|
| 3,075,166 A | 1/1963 | Peek |
| 3,558,984 A | 1/1971 | Smith et al. |

(Continued)

FOREIGN PATENT DOCUMENTS

| | | |
|---|---|---|
| EP | 1508146 A | 2/2005 |
| EP | 1938159 A | 7/2008 |

(Continued)

OTHER PUBLICATIONS

Chen et al.; Development of arc-guided protection devices against lightning breakage of covered conductors on distribution lines; IEEE Trans. Power Deliv.; 25(1); pp. 196-205; Jan. 2010.

(Continued)

*Primary Examiner* — Tung X Nguyen
(74) *Attorney, Agent, or Firm* — Shay Glenn LLP

(57) ABSTRACT

A power distribution monitoring system is provided that can include a number of features. The system can include a plurality of monitoring devices configured to attach to individual conductors on a power grid distribution network. In some embodiments, a monitoring device is disposed on each conductor of a three-phase network and utilizes a split-core transformer to harvest energy from the conductors. The monitoring devices can be configured to harvest energy from the AC power grid and saturate the magnetic core of the transformer in the event of a fault condition or when harvested power is not needed. Methods of installing and using the monitoring devices are also provided.

18 Claims, 3 Drawing Sheets

(56) References Cited

U.S. PATENT DOCUMENTS

| | | |
|---|---|---|
| 3,676,740 A | 7/1972 | Schweitzer, Jr. |
| 3,686,531 A | 8/1972 | Decker et al. |
| 3,702,966 A | 11/1972 | Schweitzer, Jr. |
| 3,708,724 A | 1/1973 | Schweitzer, Jr. |
| 3,715,742 A | 2/1973 | Schweitzer, Jr. |
| 3,720,872 A | 3/1973 | Russell et al. |
| 3,725,832 A | 4/1973 | Schweitzer, Jr. |
| 3,755,714 A | 8/1973 | Link |
| 3,768,011 A | 10/1973 | Swain |
| 3,777,217 A | 12/1973 | Groce et al. |
| 3,816,816 A | 6/1974 | Schweitzer, Jr. |
| 3,866,197 A | 2/1975 | Schweitzer, Jr. |
| 3,876,911 A | 4/1975 | Schweitzer, Jr. |
| 3,957,329 A | 5/1976 | McConnell |
| 3,970,898 A | 7/1976 | Baumann et al. |
| 4,063,161 A | 12/1977 | Pardis |
| 4,152,643 A | 5/1979 | Schweitzer, Jr. |
| 4,339,792 A | 7/1982 | Yasumura et al. |
| 4,378,525 A | 3/1983 | Burdick |
| 4,396,794 A | 8/1983 | Stiller |
| 4,396,968 A | 8/1983 | Stiller |
| 4,398,057 A | 8/1983 | Shankle et al. |
| 4,408,155 A | 10/1983 | McBride |
| 4,466,071 A | 8/1984 | Russell, Jr. |
| 4,559,491 A | 12/1985 | Saha |
| 4,570,231 A | 2/1986 | Bunch |
| 4,584,523 A | 4/1986 | Elabd |
| 4,649,457 A | 3/1987 | Talbot et al. |
| 4,654,573 A | 3/1987 | Rough et al. |
| 4,709,339 A | 11/1987 | Fernandes |
| 4,714,893 A | 12/1987 | Smith Vaniz et al. |
| 4,723,220 A | 2/1988 | Smith Vaniz |
| 4,728,887 A | 3/1988 | Davis |
| 4,746,241 A | 5/1988 | Burbank |
| 4,766,549 A | 8/1988 | Schweitzer, III et al. |
| 4,775,839 A | 10/1988 | Kosina et al. |
| 4,808,916 A | 2/1989 | Smith Vaniz |
| 4,829,298 A | 5/1989 | Fernandes |
| 4,881,028 A | 11/1989 | Bright |
| 4,886,980 A | 12/1989 | Fernandes et al. |
| 4,904,932 A | 2/1990 | Schweitzer, Jr. |
| 4,937,769 A | 6/1990 | Verbanets |
| 5,006,846 A | 4/1991 | Granville et al. |
| 5,125,738 A | 6/1992 | Kawamura et al. |
| 5,138,265 A | 8/1992 | Kawamura et al. |
| 5,159,561 A | 10/1992 | Watanabe et al. |
| 5,181,026 A | 1/1993 | Granville |
| 5,182,547 A | 1/1993 | Griffith |
| 5,202,812 A | 4/1993 | Shinoda et al. |
| 5,206,595 A | 4/1993 | Wiggins et al. |
| 5,220,311 A | 6/1993 | Schweitzer, Jr. |
| 5,428,549 A | 6/1995 | Chen |
| 5,438,256 A | 8/1995 | Thuries et al. |
| 5,473,244 A | 12/1995 | Libove et al. |
| 5,495,169 A | 2/1996 | Smith |
| 5,550,476 A | 8/1996 | Lau et al. |
| 5,565,783 A | 10/1996 | Lau et al. |
| 5,600,248 A | 2/1997 | Westrom et al. |
| 5,608,328 A | 3/1997 | Sanderson |
| 5,650,728 A | 7/1997 | Rhein et al. |
| 5,656,931 A | 8/1997 | Lau et al. |
| 5,682,100 A | 10/1997 | Rossi et al. |
| 5,696,788 A | 12/1997 | Choi et al. |
| 5,712,796 A | 1/1998 | Ohura et al. |
| 5,729,144 A | 3/1998 | Cummins |
| 5,737,203 A | 4/1998 | Barrett |
| 5,764,065 A | 6/1998 | Richards et al. |
| 5,839,093 A | 11/1998 | Novosel et al. |
| 5,892,430 A | 4/1999 | Wiesman et al. |
| 5,905,646 A | 5/1999 | Crewson et al. |
| 5,990,674 A | 11/1999 | Schweitzer, Jr. |
| 6,002,260 A | 12/1999 | Lau et al. |
| 6,016,105 A | 1/2000 | Schweitzer, Jr. |
| 6,043,433 A | 3/2000 | Schweitzer, Jr. |
| 6,133,723 A | 10/2000 | Feight |
| 6,133,724 A | 10/2000 | Schweitzer, Jr. et al. |
| 6,288,632 B1 | 9/2001 | Hoctor et al. |
| 6,292,340 B1 | 9/2001 | O'Regan et al. |
| 6,347,027 B1 | 2/2002 | Nelson et al. |
| 6,433,698 B1 | 8/2002 | Schweitzer, Jr. et al. |
| 6,459,998 B1 | 10/2002 | Hoffman |
| 6,466,030 B2 | 10/2002 | Hu et al. |
| 6,466,031 B1 | 10/2002 | Hu et al. |
| 6,477,475 B1 | 11/2002 | Takaoka et al. |
| 6,483,435 B2 | 11/2002 | Saha et al. |
| 6,549,880 B1 | 4/2003 | Willoughby et al. |
| 6,559,651 B1 | 5/2003 | Crick |
| 6,566,854 B1 | 5/2003 | Hagmann et al. |
| 6,577,108 B2 | 6/2003 | Hubert et al. |
| 6,601,001 B1 | 7/2003 | Moore |
| 6,622,285 B1 | 9/2003 | Rust et al. |
| 6,677,743 B1 | 1/2004 | Coolidge et al. |
| 6,718,271 B1 | 4/2004 | Tobin |
| 6,734,662 B1 | 5/2004 | Fenske |
| 6,798,211 B1 | 9/2004 | Rockwell et al. |
| 6,822,457 B2 | 11/2004 | Borchert et al. |
| 6,822,576 B1 | 11/2004 | Feight et al. |
| 6,879,917 B2 | 4/2005 | Turner |
| 6,894,478 B1 | 5/2005 | Fenske |
| 6,914,763 B2 | 7/2005 | Reedy |
| 6,917,888 B2 | 7/2005 | Logvinov et al. |
| 6,927,672 B2 | 8/2005 | Zalitsky et al. |
| 6,949,921 B1 | 9/2005 | Feight et al. |
| 6,963,197 B1 | 11/2005 | Feight et al. |
| 6,980,090 B2 | 12/2005 | Mollenkopf |
| 7,023,691 B1 | 4/2006 | Feight et al. |
| 7,046,124 B2 | 5/2006 | Cope et al. |
| 7,053,601 B1 | 5/2006 | Fenske et al. |
| 7,072,163 B2 | 7/2006 | McCollough, Jr. |
| 7,076,378 B1 | 7/2006 | Huebner |
| 7,085,659 B2 | 8/2006 | Peterson et al. |
| 7,106,048 B1 | 9/2006 | Feight et al. |
| 7,158,012 B2 | 1/2007 | Wiesman et al. |
| 7,187,275 B2 | 3/2007 | McCollough, Jr. |
| 7,203,622 B2 | 4/2007 | Pan et al. |
| 7,272,516 B2 | 9/2007 | Wang et al. |
| 7,295,133 B1 | 11/2007 | McCollough, Jr. |
| 7,400,150 B2 | 7/2008 | Cannon |
| 7,424,400 B2 | 9/2008 | McCormack et al. |
| 7,449,991 B2 | 11/2008 | Mollenkopf |
| 7,450,000 B2 | 11/2008 | Gidge et al. |
| 7,508,638 B2 | 3/2009 | Hooper |
| 7,518,529 B2 | 4/2009 | O'Sullivan et al. |
| 7,532,012 B2 | 5/2009 | Cern |
| 7,557,563 B2 | 7/2009 | Gunn et al. |
| 7,626,794 B2 | 12/2009 | Swartzendruber et al. |
| 7,633,262 B2 | 12/2009 | Lindsey et al. |
| 7,672,812 B2 | 3/2010 | Stoupis et al. |
| 7,683,798 B2 | 3/2010 | Rostron |
| 7,701,356 B2 | 4/2010 | Curt et al. |
| 7,714,592 B2 | 5/2010 | Radtke et al. |
| 7,720,619 B2 | 5/2010 | Hou |
| 7,725,295 B2 | 5/2010 | Stoupis et al. |
| 7,742,393 B2 | 6/2010 | Bonicatto et al. |
| 7,764,943 B2 | 7/2010 | Radtke |
| 7,795,877 B2 | 9/2010 | Radtke et al. |
| 7,795,994 B2 | 9/2010 | Radtke |
| 7,804,280 B2 | 9/2010 | Deaver, Sr. et al. |
| 7,930,141 B2 | 4/2011 | Banting |
| 8,421,444 B2 | 4/2013 | Gunn |
| 8,497,781 B2 | 7/2013 | Engelhardt et al. |
| 8,594,956 B2 | 11/2013 | Banting et al. |
| 8,786,292 B2 | 7/2014 | Parsons |
| 9,182,429 B2 | 11/2015 | Saxby et al. |
| 9,229,036 B2 | 1/2016 | Kast et al. |
| 9,448,257 B2 | 9/2016 | Saxby et al. |
| 9,581,624 B2 | 2/2017 | Rostron |
| 2004/0156154 A1 | 8/2004 | Lazarovich et al. |
| 2005/0073200 A1 | 4/2005 | Divan et al. |
| 2008/0077336 A1 | 3/2008 | Fernandes |
| 2009/0058582 A1 | 3/2009 | Webb |
| 2009/0309754 A1 | 12/2009 | Bou et al. |
| 2010/0085036 A1 | 4/2010 | Banting et al. |
| 2011/0032739 A1 | 2/2011 | Juhlin |

(56) References Cited

U.S. PATENT DOCUMENTS

| | | |
|---|---|---|
| 2012/0039062 A1 | 2/2012 | McBee et al. |
| 2012/0236611 A1 | 9/2012 | Alexandrov et al. |
| 2013/0162136 A1 | 6/2013 | Baldwin et al. |
| 2014/0062221 A1* | 3/2014 | Papastergiou ......... H02H 9/002 307/126 |
| 2014/0145858 A1 | 5/2014 | Miller et al. |
| 2014/0174170 A1 | 6/2014 | Davis |
| 2014/0192458 A1 | 7/2014 | Valdes |
| 2014/0226366 A1 | 8/2014 | Morokuma et al. |
| 2014/0260598 A1 | 9/2014 | Miller |
| 2015/0198667 A1 | 7/2015 | Krekeler |
| 2016/0116505 A1 | 4/2016 | Kast et al. |
| 2016/0197470 A1 | 7/2016 | Baker et al. |
| 2017/0199533 A1* | 7/2017 | McCollough ........... G05F 1/335 |

FOREIGN PATENT DOCUMENTS

| | | |
|---|---|---|
| EP | 2340592 A | 7/2011 |
| EP | 2350764 A | 8/2011 |

OTHER PUBLICATIONS

Chen Yang Technologies; Split core hall effect dc current sensor CYHCT-C2TC; 4 pages; retrieved from the internet Jan. 5, 2015 (http://www.hallsensors.de/CYHCT-C2TC.pdf) (Product Information).

Saha et al.; Fault Location on Power Networks (Power Systems); Springer Verlag; London, UK; 435 pgs.; 2010 (Preface: Oct. 2009).

Shepard et al.; An overview of rogowski coil current sensing technology; 13 pages; retrieved from the internet Jan. 5, 2016(http://www.dynamp.net/Idadocum.nsf/c2270fbdd892ac3e86256e75000ad88a/e710af6d3e0f6255862565d7004b19db/$FILE/Report.pdf).

Stringfield et al.; Fault location methods for overhead lines; in Transactions of the American Institute of Electrical Engineers; Amer. Inst. of Electrical Eng.; New York, NY; Part. III; vol. 76; pp. 518-530; Aug. 1957.

* cited by examiner

CURRENT HARVESTING TRANSFORMER WITH PROTECTION FROM HIGH CURRENTS

CROSS REFERENCE TO RELATED APPLICATIONS

This application claims the benefit of U.S. Provisional Appln. No. 62/263,512, filed Dec. 4, 2015, which application is herein incorporated by reference in its entirety.

INCORPORATION BY REFERENCE

All publications and patent applications mentioned in this specification are herein incorporated by reference to the same extent as if each individual publication or patent application was specifically and individually indicated to be incorporated by reference.

FIELD

The present application relates generally to distribution line monitoring, sensor monitoring, and power harvesting.

BACKGROUND

Power harvesting using induction pick-up from the magnetic field surrounding a power distribution line can be used to provide power to distribution line monitoring sensors. Typically, the power line is routed through a current transformer whereby an AC signal is derived from the magnetic field induced by the AC current flow in the distribution line. The AC signal is converted to DC as part of the power harvesting process and used to power the monitoring sensors and associated electronics. This is typically referred to as "inductive harvesting using current transformers."

One method of mounting the current transformer (C.T.) on the distribution line is to cut the C.T. in two, mount the halves around the uncut distribution line, and mechanically hold the two C.T. halves together. Because the changing magnetic field (AC) causes the magnetic force of attraction between halves of a split core current transformer to alternate between a zero force and a peak force at twice the AC line frequency, the core halves need to be mechanically held together, which can be challenging in a hot-stick deployed sensor application.

Such current transformers, when combined with power conversion circuitry, can provide power to the internal circuitry of the sensor.

A power converter, as typically connected to an electrical source, needs to be designed to operate over a range of inputs appropriate for that application. Common cord-connected equipment, for example, might have a requirement to operate with an input that may vary 10% from a certain nominal voltage. Likewise, electrical devices in automobiles operate over a certain range of allowable inputs voltages. Power line sensors, however, have a challenging requirement because of their need to operate over very wide ranges of inputs. For example, a sensor may be specified to operate from 5 amps to 1000 amps. Designing sensors for such applications require specialized circuitry to provide the stable, fixed power to operate the internal circuitry.

SUMMARY OF THE DISCLOSURE

In one embodiment, a method of monitoring a power grid distribution network is provided, comprising the steps of harvesting energy from a conductor line of the power grid distribution network with a split-core transformer of a monitoring device installed on the conductor line, powering the monitoring device with the harvested energy, during normal conductor line conditions, creating a DC current in the split-core transformer with a half-wave control circuit of the monitoring device to saturate a magnetic core of the split-core transformer during positive half-cycles to limit harvested energy, and in the event of fault conditions on the conductor line, creating the DC current in the split-core transformer with a full-wave control circuit of the monitoring device to saturate the magnetic core of the split-core transformer during negative and positive half-cycles to prevent harvested energy.

In one embodiment, currents between 20-1400 amps flow in the conductor line during normal conductor line conditions.

In another embodiment, the method further comprises conducting current through a Zener diode in a reverse direction to allow a TRIAC to conduct the DC current to short the split-core transformer during positive half-cycles.

In some embodiments, currents greater than 1400 amps flow in the conductor line during fault conditions.

In one embodiment, the method further comprises conducting current through a Zener diode in a reverse direction to create a voltage across a resistor which allows a TRIAC to conduct the DC current to short the split-core transformer during negative half-cycles.

A method of monitoring a power grid distribution network is provided, comprising the steps of harvesting energy from a conductor line of the power grid distribution network with a harvesting coil wound around a split-core transformer of a monitoring device installed on the conductor line; powering the monitoring device with the harvested energy, creating a DC current in the harvesting coil with a half-wave control circuit of the monitoring device to short the split-core transformer to limit harvested energy during positive half-cycles, and in the event of an abnormally high current on the conductor line, changing the half-wave control circuit to a full-wave control circuit and creating the DC current in the harvesting coil with the full-wave control circuit to short the split-core transformer to limit harvested energy during positive and negative half-cycles.

In some embodiments, the DC current is created with the half-wave control circuit at moderate currents between 2-1400 amps in the conductor line.

In another embodiment, the method further comprises conducting current through a Zener diode in a reverse direction to allow a TRIAC to conduct the DC current to short the split-core transformer during positive half-cycles.

In one embodiment, the DC current is created with the full-wave control circuit at high currents above 1400 amps in the conductor line.

In another embodiment, the method further comprises conducting current through a Zener diode in a reverse direction to create a voltage across a resistor which allows a TRIAC to conduct the DC current to short the split-core transformer during negative half-cycles.

A power line monitoring device is provided, comprising a split-core current transformer comprising first and second core halves, the split-core transformer being configured to harvest energy from a conductor line of a power grid distribution network to power the power line monitoring device, secondary windings disposed around at least the first core half of the split-core transformer, and a control circuit electrically coupled to the secondary windings, the control circuit configured to create a DC current to short the secondary windings to limit harvested energy during positive half-cycles, and in the event of an abnormally high current on the conductor line, being configured to create the DC to short the secondary windings to limit harvested energy during positive and negative half-cycles.

In one embodiment, the control circuit comprises a first Zener diode, a second Zener diode, a third Zener diode, a fourth Zener diode, a resistor, and a TRIAC.

In one embodiment, the first Zener diode, the second Zener diode, and the TRIAC combine to form a half-wave control circuit that shorts the secondary windings to limit harvested energy during positive half-cycles.

In another embodiment, current is conducted through the first Zener diode in a reverse direction to allow the TRIAC to conduct the DC current to short the secondary windings during positive half-cycles.

In one embodiment, the half-wave circuit shorts the secondary windings at normal line currents in the conductor line between 20-1400 amps.

In another embodiment, the third Zener diode, the fourth Zener diode, the resistor, and the TRIAC combine with the half-wave control circuit to form a full-wave control circuit that shorts the secondary windings to limit harvested energy during negative and positive half-cycles.

In some embodiments, current is conducted through the third Zener diode in a reverse direction to create a voltage across the resistor, which allows the TRIAC to conduct the DC current to short the secondary windings during negative half-cycles.

In one embodiment, the full-wave circuit shorts the secondary windings at extreme line currents in the conductor line above 1400 amps.

BRIEF DESCRIPTION OF THE DRAWINGS

The novel features of the invention are set forth with particularity in the claims that follow. A better understanding of the features and advantages of the present invention will be obtained by reference to the following detailed description that sets forth illustrative embodiments, in which the principles of the invention are utilized, and the accompanying drawings of which:

DETAILED DESCRIPTION

Figure 1A:
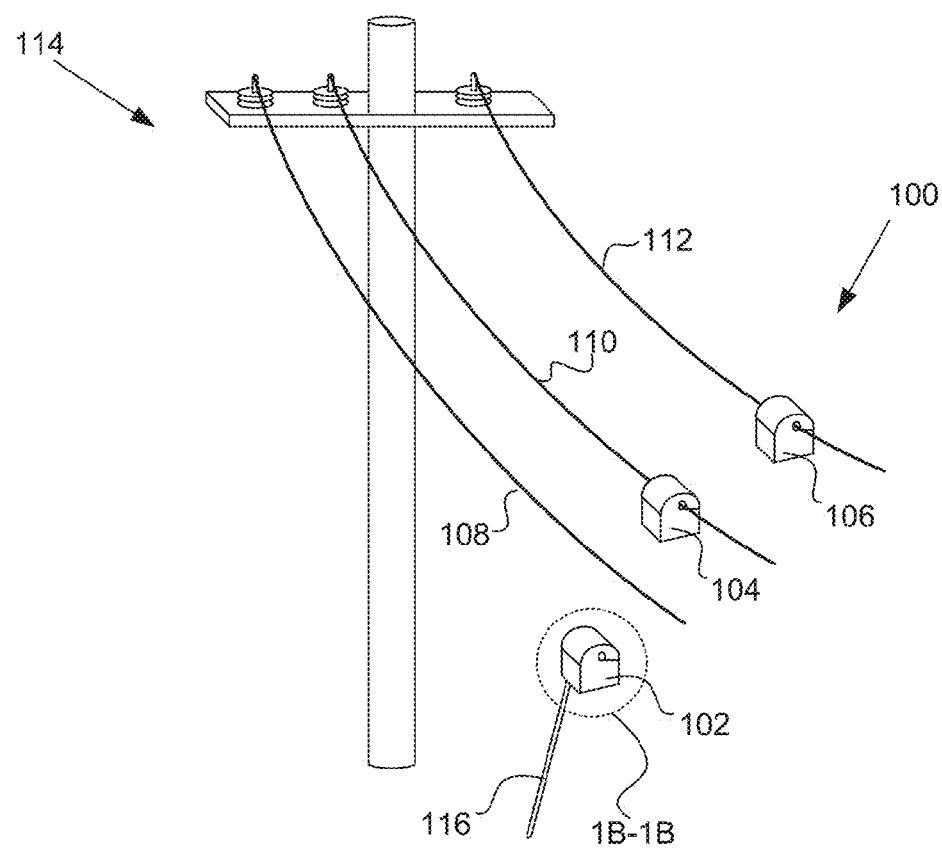
FIG. 1A is a typical over-head three-phase power distribution system utilizing a cross-bar mounted on pole for mechanical positioning of the conductors. Alternate patterns of parallel conductor routing are sometimes used. Power distribution line monitoring devices (102,104,106) are attached to the power lines typically using a standard lineman's shotgun hotstick (106) for easy deployment with necessitating turning off power in the lines.

Power line monitoring devices and systems described herein are configured to measure the currents and voltages of power grid distribution networks. Referring to FIG. 1A, monitoring system 100 comprises monitoring devices 102, 104, and 106 mounted to power lines 108, 110, and 112, respectively, of power distribution network 114. The power distribution network can be a three phase AC network, or alternatively, a single-phase network, for example. The power distribution network can be any type of network, such as a 60 Hz North American network, or alternatively, a 50 Hz network such as is found in Europe and Asia, for example. Power distribution networks, such as in the United States, typically operate at a medium voltage (e.g., 4 kV to 65 kV or higher) to reduce the energy lost during transmission over long distances. The monitoring devices can also be used on high voltage "transmission lines" that operate at voltages higher than 65 kV.

Figure 1B:
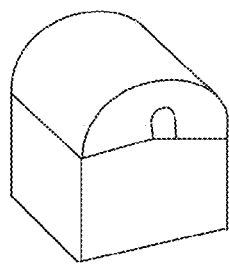
FIGS. 1B and 1C show a schematic representation of a monitoring sensor in the closed (1B) and open (1C) positions. The open position facilitates mounting the monitoring sensor on a power line. The sensor remains on the power line in the closed (1B) position.
Figure 1C:
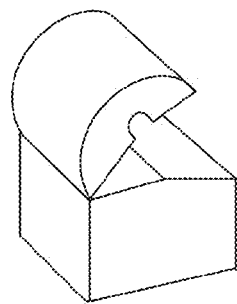

Monitoring devices 102, 104, and 106 can be mounted on each power line of a three-phase network, as shown, and can be configured to monitor, among other things, current flow in the power line and current waveforms, conductor temperatures, ambient temperatures, vibration, wind speed and monitoring device system diagnostics. In some embodiments, a fourth sensor can be mounted on the ground line near the three phase lines. In additional embodiments, multiple sensors can be used on a single phase line. The monitoring devices can be mounted quickly and easily via a hot-stick 116, and can harvest energy from the power lines for operation with or without additional supplemental power (e.g., include batteries or solar panels). The monitoring devices can further include wireless transmission and receiving capabilities for communication with a central server and for communications between each monitoring device. Installation of a three monitoring device array can be placed and configured by a single linesman with a hot-stick and a bucket truck in less than 20 minutes. Monitoring device communication with the installation crew can be enabled during the installation process to provide immediate verification of successful installation. FIG. 1B illustrates a monitoring device in a closed/clamped configuration, and FIG. 1C shows the monitoring device in an opened/installation configuration. It should be understood that the device is opened into the installation configuration during installation on power lines, then closed around the line in the clamped configuration prior to operation.

Furthermore, monitoring devices 102, 104, and 106 are configured to also measure the electric field surrounding the power lines, to record and analyze event/fault signatures, and to classify event waveforms. Current and electric field waveform signatures can be monitored and catalogued by the monitoring devices to build a comprehensive database of events, causes, and remedial actions. In some embodiments, an application executed on a central server can provide waveform and event signature cataloguing and profiling for access by the monitoring devices and by utility companies. This system can provide fault localization information with remedial action recommendations to utility companies, pre-emptive equipment failure alerts, and assist in power quality management of the distribution grid.

Monitoring devices 102, 104, and 106 can comprise sensing elements, a power supply, a battery, a microprocessor board, and high powered communication systems (not shown) disposed within a robust mechanical housing designed for severe service conditions. The monitoring devices are configured to withstand temperatures ranging from −40 to +85 C., EMI and ESD immunity, current and voltage impulse resistance, driving rain and precipitation and salt fog survival. A typical embodiment of the monitoring devices is configured to operate continuously on power lines carrying up to 800 $A_{RMS}$ operating current with full functionality. Full functionality is also maintained during line fault current events up to 10 $kA_{RMS}$ and of limited time duration.

The monitoring devices can be configured to communicate wirelessly through a distribution network to the power utilities sensor control and distribution automation (SCADA) system. In some embodiments, the monitoring devices operate at differing powers with a custom designed omni-directional antenna. When mounted to typical power grid distribution networks, the monitoring devices are located approximately 30 feet above ground level and typically above tree tops, providing for a very substantial effective range of communication. In addition to two-way network communications for data packets and setting operational setpoints, the monitoring devices can be configured for wireless device firmware upgrades for long term functionality.

Figure 2:
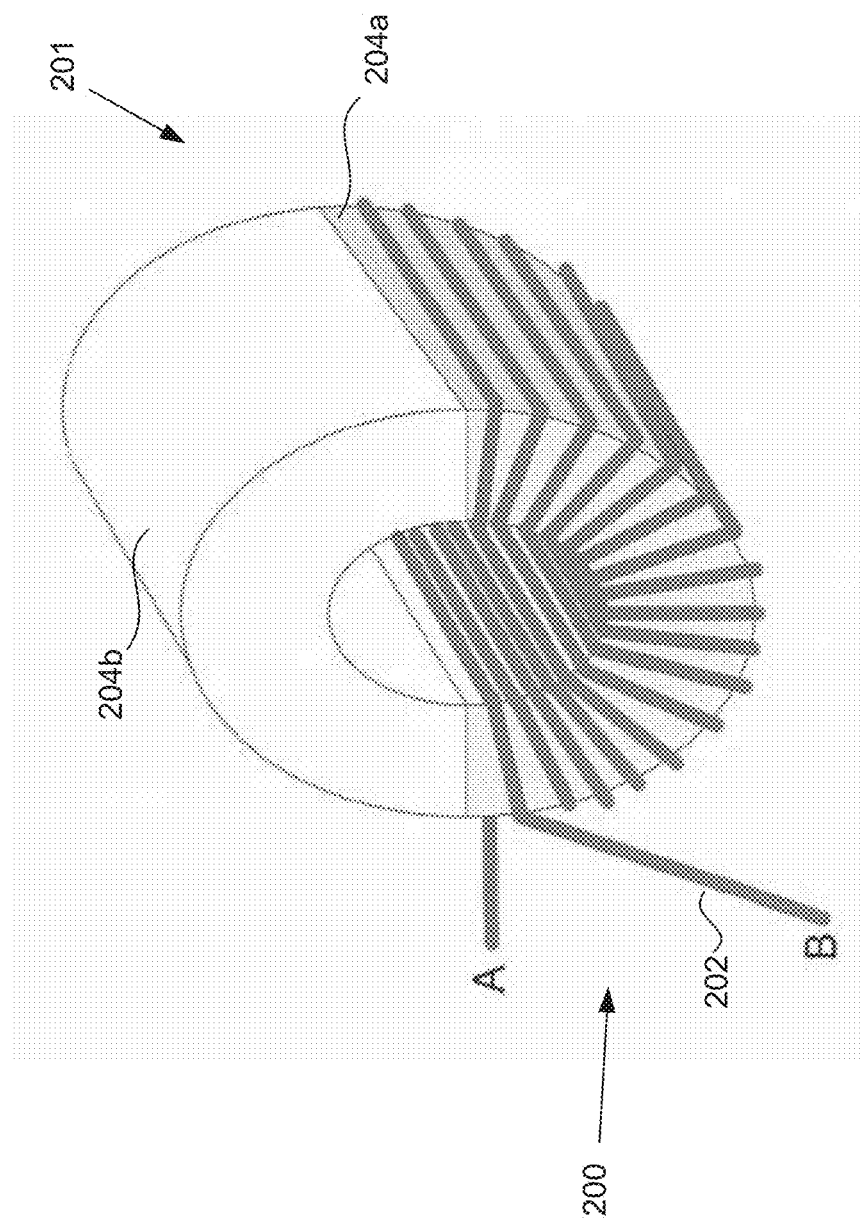
FIG. 2 shows the upper half of the power harvesting current transformer positioned above the lower half in what would be the closed position for normal operation. The upper and lower core halves separate with the mechanics of the housing to facilitate mounting the core on a power line.

The monitoring devices described herein can also include power harvesting systems configured to convert the changing magnetic field surrounding the distribution lines into current and/or voltage that can be rectified into DC current and used to power the monitoring devices. FIG. 2 illustrates one embodiment of a power harvesting system 200, which can be included in the monitoring devices 102, 104, and 106 of FIGS. 1A-1C. In some embodiments, the power harvesting system is positioned in the monitoring devices so as to surround the power lines when the monitoring devices are installed.

Referring to FIG. 2, power harvesting system 200 can include a split core transformer 201 having first and second core halves 204a and 204b. The split core transformer can include a primary winding (not shown) comprising the power line or conductor passing through the center of the two core halves, and a harvesting coil 202 around first core half 204a. The harvesting coil can be comprised, of any number of turns in order to establish the proper "turns ratio" required for the operation of the circuitry.

The current induced in the harvesting core coil supplies AC power to the electronic circuits of the monitoring devices 102, 104, and 106 of FIGS. 1A-1C. In general, the monitoring devices are designed to operate over a wide range of power grid distribution networks and operating conditions. In some embodiments, the monitoring devices are designed and configured to operate over a range of line currents between 5 amps and 800 amps. However, the monitoring devices must also be protected against fault currents in the power line up to or exceeding 25,000 amps. The monitoring devices of the present disclosure require only a few watts of power for normal operations. This amount of power can be easily obtained at the lower portion of the line current operating range. Thus, during most of the operating range it is necessary to actually limit the amount of power harvested by the monitoring devices.

Typically a power harvesting system based on a current transformer would produce an ever-increasing output voltage as the line current increases. Because fault currents in power conductors are substantially higher than operating currents (e.g., 25,000 amps vs 5-800 amps), these voltages can reach destructive levels. The present disclosure provides a control circuit configured to provide three district modes of operation, (1) no harvest power limitation, (2) limit the harvest power by means of DC saturation, and (3) avoid problems of DC saturation at extremely high currents by using AC saturation. The control circuit of the present disclosure can therefore limit the output voltage of the power harvesting system to a lower level and protect the circuitry and electrical components of the monitoring devices from destructive voltages occurring during fault currents. Because of the requirement to operate over a wide range of input currents, the critical design point is to create this desired amount of power with the lowest allowable input current, in a lightweight package.

Figure 3:
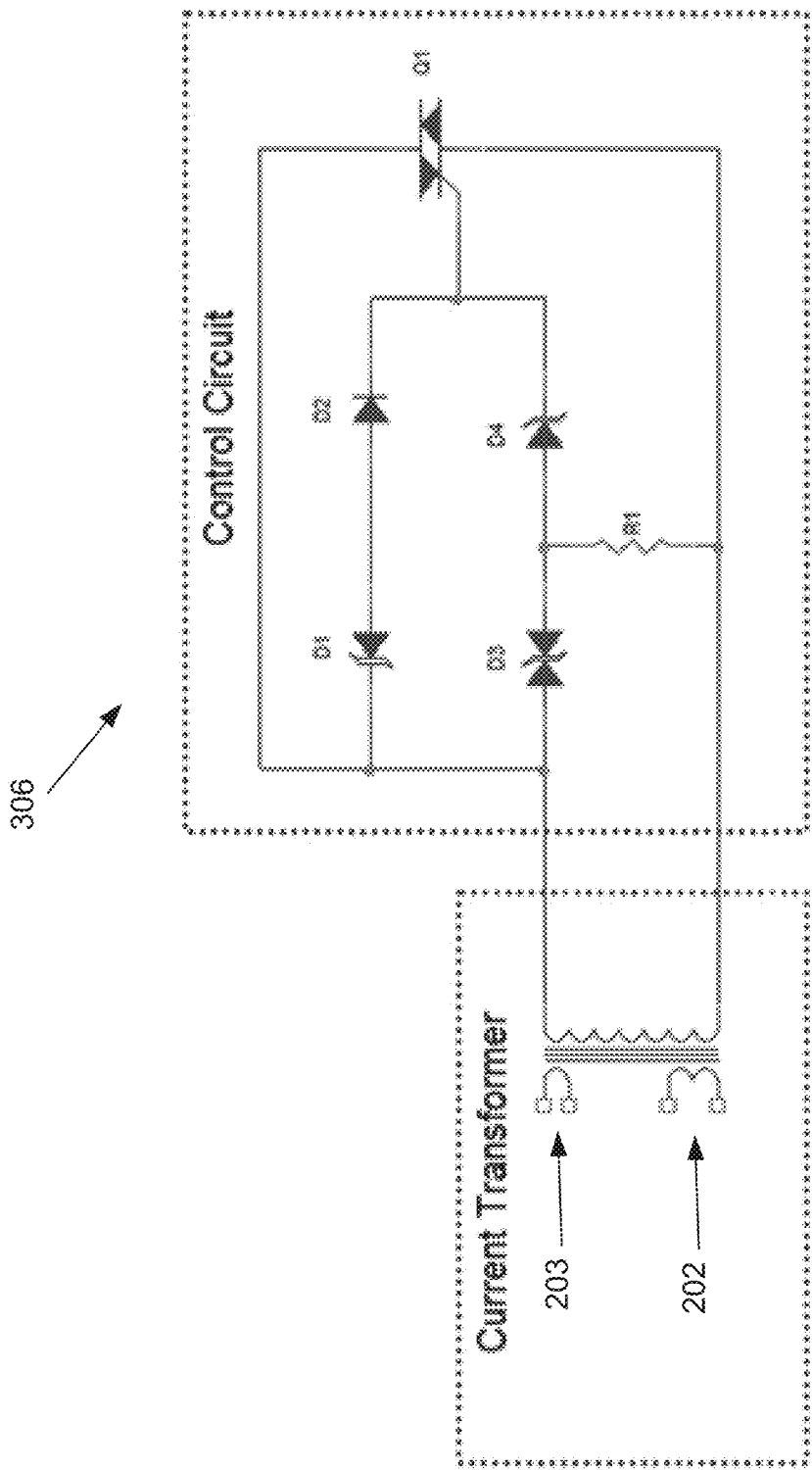
FIG. 3 shows a control circuit configured to control energy harvesting of the monitoring device and prevent damage to the device during a fault condition.

FIG. 3 illustrates a schematic diagram of a control circuit 306 connected to the harvesting coil 202 of a monitoring device, as described in FIGS. 1A-1C and FIG. 2. The monitoring device can be mounted on a primary conductor 203. The control circuit can be configured to drive the split core transformer of the monitoring devices into magnetic saturation, thereby limiting the amount of harvested power in the power harvesting system. The control circuit 306 is configured to saturate the split core transformer of the monitoring device with DC to limit the power harvested, because the split core transformer is normally an AC operated device. Saturating the split core transformer with DC yields other desirable effects, including a reduction of audible noise due to the limitation of extreme magnetic field changes, and a strong attractive force between the two halves of the split core transformer, thereby maximizing the electrical performance and reducing or eliminating the influx of contamination between the two core halves.

The control circuit 306 of FIG. 3 operates as follows: at very low primary conductor line currents (e.g., below 20 amps), the harvesting coil 202 harvests energy during both positive and negative half-cycles. There are no electrical limitations on harvesting power at these very low line currents.

At moderate line currents (e.g., between 20-1400 amps) the control circuit 306 operates as a half-wave control circuit to short the split-core transformer to limit harvested energy during positive half-cycles. During positive half-cycles, Zener diode (D1) reaches its conduction point which triggers TRIAC (Q1). This causes Q1 to conduct DC current, which shorts the harvesting coil 202 for the remainder of the half-cycle. The conduction point of Zener diode (D3) is not reached during negative half-cycles at moderate line currents. Thus, DC current flows through TRIAC (Q1) only during positive half-cycles, which saturates the magnetic core of the split core transformer. This serves to limit the total amount of harvested power by harvesting only during negative half-cycles.

When the control circuit 306 is subjected to high line currents above the normal operating range (e.g., greater than 1400 amps), the control circuit 306 changes to a full-wave control circuit to short the split-core transformer to limit harvested energy during positive and negative half-cycles. At high line currents, Zener diode (D3) reaches its conduction point. The DC current flowing through Zener diode (D3) creates a voltage across resistor (R1). When sufficient voltage develops it will trigger TRIAC (Q1) to conduct DC current, thus shorting the harvesting coil for the remainder of the negative half-cycle.

It is important to note that triggering TRIAC (Q1) during a positive half-cycle is determined by a voltage (i.e., D1's voltage), yet triggering TRIAC (Q1) during a negative half-cycle is determined by a current (i.e., R1's voltage). In this mode of operation, power harvesting is not allowed during either positive or negative half-cycles. This allows the positive half-cycle mode and the negative half-cycle mode to initiate at slightly different criteria (e.g., between 20-1400 amps in one mode and above 1400 amps in the other mode). As should be understood, the criteria that trigger each mode can be adjusted depending on the desired operating characteristics of the device.

The control circuit can be configured to operate in three distinct mode of operation, as described above: Mode 1—harvest as much energy as possible at very low levels of line current. In this case, the power harvesting system is designed to maximize the amount of output power without any electrical limitations. Mode 2—begin to limit the amount of harvested energy as the line current increases. Harvesting more than is needed could result in increased size, complexity and heat waste. Mode 3—protect against very high line currents, as might be expected during power line fault conditions.

In any power producing circuit, there are two customary ways to stop the flow of power, open the electrical circuit (e.g., a switch), or short circuit the output. Each of these is a possible scenario. However, each will affect the transformer in a different way.

Opening the circuit will cause the power line current to generate large magnetic fields in the magnetic core of the split core transformer. These magnetic fields will generate high voltages across the primary and harvesting coils, which will have to be accounted for in the circuit design. The magnetic fields in the core will alternate polarity coinciding with the AC line frequency, but will be limited in amplitude only by the maximum "saturation" level of the core material. So therefore, in this mode, the core will alternate between its maximum positive magnetic field to its maximum negative magnetic field. Operation between these saturation values will cause several effects on the magnetic core's magnetic material. It produces heat, due to various losses inside the core material, and it becomes audibly loud, due to magnetostriction and other magnetic forces. However, one benefit of operating with an open circuit, it that the power lost in the harvesting coil is very small, because winding current only flows during the small portion of the line cycles when harvest power is needed.

In contrast to opening the circuit, described above, the preferred method to remove power from a current transformer is to short-circuit the harvesting coil. In this case, virtually no output voltage produced. The magnetic field inside the core material is also relatively small, so the core's losses are smaller, and the audible noise is lower.

However, to achieve this condition, the split core transformer must be allowed to transform the power line current into harvesting coil current (by the ratio of the number of turns). Conventionally, this would require a larger diameter core to be used, due to the need "balance" the amp-turns of the primary winding with the amp-turns of the harvesting coil. Of course, this larger core is heavier, due both to the increased core material, and also due to the weight of the copper winding.

In both of these conditions: open-circuiting and short-circuiting, the power line current produces alternate, symmetric magnetic fields, in the core material. The principles of transformer design say that power is only transformed as the magnetic field is changing. Thus, in the Mode 2 of operation, the control circuit can limit the power produced by creating a strong DC bias in the magnetic core, and only allowing the magnetic field to change when harvest power is required.

A noteworthy aspect of this design is that the creation of DC is derived from the half-wave control circuit. This control circuit has only half the average current of a classic transformer's circuit, so the amount of copper in the harvesting coil is reduced. This is accompanied by a reduction in size and weight.

The half-wave circuit, described above, although having a lower size and weight, cannot survive extreme fault currents. As stated earlier, a conventional current transformer must balance the amp-turns of the primary coil with the amp-turns of the harvesting coil. However, the control circuit of the present disclosure uses less copper due to the half-wave (DC) mode of operation. The Mode 3 of operation exploits the use of less copper. For example, above the normal operating range of currents, the control circuit can change the half-wave circuit to a full-wave circuit, and thus remove the DC bias of the magnetic field, which reverts to a full AC swing of the magnetic field. However, the resistance of the harvesting coil (which is determined by the Mode 2 parameters) will force the transformer to magnetically saturate due to the high voltage requirement of that winding. At high fault currents, the saturation occurs early in the line cycle, so the transformer, being saturated, cannot transform the high current of the primary fault current into a proportionally high current in the harvesting coil. This limitation of the winding current again goes towards a reduction in size and weight of the transformer.

In some embodiments, the control circuit can be connected to either the harvesting coil or coupled to a separate coil on the transformer. For example, in one specific embodiment, the harvesting coil can comprise 13 turns of a coiled wire, the control circuit can be coupled to a separate 300 turn control circuit coil. In transformer theory, the number of turns sets the voltage-to-current ratio. In this embodiment, the triac used in the control circuit includes a certain current rating requires a lower current that can be achieved by using more turns in the control circuit coil. Different embodiments may require individual engineering for the number of turns, but one or two coils for the energy harvesting and for the control circuit gives lots of freedom in the design. Because the two coils are on the same core, they "move" together, only differing by the voltage/current of each. The "magic" of transformers is that if the voltage is limited on one coil, the voltage is automatically limited on all coils.

As for additional details pertinent to the present invention, materials and manufacturing techniques may be employed as within the level of those with skill in the relevant art. The same may hold true with respect to method-based aspects of the invention in terms of additional acts commonly or logically employed. Also, it is contemplated that any optional feature of the inventive variations described may be set forth and claimed independently, or in combination with any one or more of the features described herein. Likewise, reference to a singular item, includes the possibility that there are plural of the same items present. More specifically, as used herein and in the appended claims, the singular forms "a," "and," "said," and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Unless defined otherwise herein, all technical and scientific terms used herein have the same meaning as commonly understood by one of ordinary skill in the art to which this invention belongs. The breadth of the present invention is not to be limited by the subject specification, but rather only by the plain meaning of the claim terms employed.

What is claimed is:

1. A method of monitoring a power grid distribution network, comprising the steps of:
   harvesting energy from a conductor line of the power grid distribution network with a split-core transformer of a monitoring device installed on the conductor line;
   powering the monitoring device with the harvested energy;
   during normal conductor line conditions, creating a DC current in the split-core transformer with a half-wave control circuit of the monitoring device to saturate a magnetic core of the split-core transformer during positive half-cycles to limit harvested energy; and
   in the event of fault conditions on the conductor line, creating the DC current in the split-core transformer with a full-wave control circuit of the monitoring device to saturate the magnetic core of the split-core transformer during negative and positive half-cycles to prevent harvested energy.

2. The method of claim 1, wherein currents between 20-1400 amps flow in the conductor line during normal conductor line conditions.

3. The method of claim 1, further comprising conducting current through a Zener diode in a reverse direction to allow a TRIAC to conduct the DC current to short the split-core transformer during positive half-cycles.

4. The method of claim 1, wherein currents greater than 1400 amps flow in the conductor line during fault conditions.

5. The method of claim 1, further comprising conducting current through a Zener diode in a reverse direction to create a voltage across a resistor which allows a TRIAC to conduct the DC current to short the split-core transformer during negative half-cycles.

6. A method of monitoring a power grid distribution network, comprising the steps of:
   harvesting energy from a conductor line of the power grid distribution network with a harvesting coil wound around a split-core transformer of a monitoring device installed on the conductor line;
   powering the monitoring device with the harvested energy;
   creating a DC current in the harvesting coil with a half-wave control circuit of the monitoring device to short the split-core transformer to limit harvested energy during positive half-cycles; and
   in the event of an abnormally high current on the conductor line, changing the half-wave control circuit to a full-wave control circuit and creating the DC current in the harvesting coil with the full-wave control circuit to short the split-core transformer to limit harvested energy during positive and negative half-cycles.

7. The method of claim 6, wherein the DC current is created with the half-wave control circuit at moderate currents between 2-1400 amps in the conductor line.

8. The method of claim 7, further comprising conducting current through a Zener diode in a reverse direction to allow a TRIAC to conduct the DC current to short the split-core transformer during positive half-cycles.

9. The method of claim 1, wherein the DC current is created with the full-wave control circuit at high currents above 1400 amps in the conductor line.

10. The method of claim 9, further comprising conducting current through a Zener diode in a reverse direction to create a voltage across a resistor which allows a TRIAC to conduct the DC current to short the split-core transformer during negative half-cycles.

11. A power line monitoring device, comprising:
    a split-core current transformer comprising first and second core halves, the split-core transformer being configured to harvest energy from a conductor line of a power grid distribution network to power the power line monitoring device;
    secondary windings disposed around at least the first core half of the split-core transformer; and
    a control circuit electrically coupled to the secondary windings, the control circuit configured to create a DC current to short the secondary windings to limit harvested energy during positive half-cycles, and in the event of an abnormally high current on the conductor line, being configured to create the DC to short the secondary windings to limit harvested energy during positive and negative half-cycles.

12. The device of claim 11, wherein the control circuit comprises:
    a first Zener diode;
    a second Zener diode;
    a third Zener diode;
    a fourth Zener diode;
    a resistor; and
    a TRIAC.

13. The device of claim 12, wherein the first Zener diode, the second Zener diode, and the TRIAC combine to form a half-wave control circuit that shorts the secondary windings to limit harvested energy during positive half-cycles.

14. The device of claim 13, wherein current is conducted through the first Zener diode in a reverse direction to allow the TRIAC to conduct the DC current to short the secondary windings during positive half-cycles.

15. The device of claim 13, wherein the half-wave circuit shorts the secondary windings at normal line currents in the conductor line between 20-1400 amps.

16. The device of claim 13, wherein the third Zener diode, the fourth Zener diode, the resistor, and the TRIAC combine with the half-wave control circuit to form a full-wave control circuit that shorts the secondary windings to limit harvested energy during negative and positive half-cycles.

17. The device of claim 16, wherein current is conducted through the third Zener diode in a reverse direction to create a voltage across the resistor, which allows the TRIAC to conduct the DC current to short the secondary windings during negative half-cycles.

18. The device of claim 16, wherein the full-wave circuit shorts the secondary windings at extreme line currents in the conductor line above 1400 amps.

* * * * *